United States Patent
Woo et al.

(10) Patent No.: US 6,727,592 B1
(45) Date of Patent: Apr. 27, 2004

(54) COPPER INTERCONNECT WITH IMPROVED BARRIER LAYER

(75) Inventors: Christy Mei-Chu Woo, Cupertino, CA (US); John E. Sanchez, Palo Alto, CA (US); Darrell M. Erb, Los Altos, CA (US); Amit P. Marathe, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/079,515

(22) Filed: Feb. 22, 2002

(51) Int. Cl.[7] ............... H01L 23/48; H01L 23/52; H01L 21/4763; H01L 21/44
(52) U.S. Cl. .............. 257/762; 257/761; 257/763; 438/648; 438/656; 438/683; 438/685; 438/687
(58) Field of Search ................ 257/751, 753, 257/761, 762, 763, 767, 768; 438/627, 643, 648, 653, 656, 683, 685, 687

(56) References Cited

U.S. PATENT DOCUMENTS

| 6,221,757 | B1 |   | 4/2001 | Schmidbauer et al. | ...... 438/625 |
| 6,291,885 | B1 | * | 9/2001 | Cabral et al.      | ...... 257/751 |
| 6,342,448 | B1 | * | 1/2002 | Lin et al.         | ...... 438/687 |
| 6,562,715 | B1 | * | 5/2003 | Chen et al.        | ...... 438/643 |

* cited by examiner

*Primary Examiner*—Hung Vu

(57) ABSTRACT

A Cu interconnect, e.g.; a dual damascene structure, is formed with improved electromigration resistance and increased via chain yield by depositing a barrier layer in an opening by CVD, depositing a flash layer of α-Ta by PVD, at a thickness less than 30 Å, on the bottom of the barrier layer, depositing a seedlayer and then filling the opening with Cu. Embodiments include depositing a thin α-Ta layer, as at a thickness less than 10 Å, and/or as discontinuous regions of clusters of atoms on sides of the opening.

16 Claims, 12 Drawing Sheets

COPPER INTERCONNECT WITH IMPROVED BARRIER LAYER

TECHNICAL FIELD

The present invention relates to copper (Cu) and/or Cu alloy metallization in semiconductor devices, and to a method for manufacturing semiconductor devices with reliable, low resistance Cu or Cu alloy interconnects exhibiting improved electromigration resistance and increased via chain yield. The present invention is particularly applicable to high speed integrated circuits having submicron design features and high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing reliable low RxC (resistance x capacitance) interconnect patterns with higher electromigration resistance.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization have become more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RxC delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

In implementing Cu metallization, particularly in damascene techniques wherein an opening is formed in a dielectric layer, particularly a dielectric layer having a low dielectric constant, e.g., a dielectric constant less than about 3.9, various reliability, elecromigration and resistance issues are generated. Reliability issues stem, in part, from the difficulty in depositing a conformal barrier, such as tantalum nitride (TaN), by physical vapor deposition (PVD) techniques which are limited by the line of sight deposition. Chemical vapor deposition (CVD) of a barrier layer would provide better conformal coverage, particularly in geometries less than 1,000 Å. However, although CVD provides superior step coverage of the barrier metal layer, a disadvantageous interaction occurs with the seedlayer which deposited by PVD. Such an adverse interaction results in degradation of the interface between the CVD barrier layer and PVD seedlayer giving rise to a high contact resistance and poor feature filling adversely impacting the reliability of the contact or via. This problem has been found difficult to resolve without sacrificing electromigration resistance and via chain yield.

Accordingly, there exist a need for reliable, low resistance Cu and Cu alloy interconnects exhibiting improved electromigration resistance and increased via chain yield, and for enabling methodology.

DISCLOSURE OF THE INVENTION

An advantage of the present invention is a semiconductor device having reliable, low resistance Cu or Cu alloy interconnects with improved electromigration resistance and increased via chain yields.

Another advantage of the present invention is the method of manufacturing a semiconductor device having reliable, low resistance Cu or Cu alloy interconnects with improved electromigration resistance and increased via chain yield.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device comprising: an opening formed in a dielectric layer; a barrier layer lining the opening, the barrier layer comprising a bottom portion and side portions; a layer of tantalum (Ta), deposited by physical vapor deposition and having a thickness less than 30 Å, on the bottom portion of the barrier layer; a seedlayer on the Ta layer and over the side portions of the barrier layer; and copper (Cu) or a Cu alloy filling the opening.

Embodiments of the present invention comprise depositing an alpha ($\alpha$)-Ta layer by PVD at a thickness of about 5

Å to about 30 Å, e.g. at about 8 Å to about 24 Å, on the bottom portion of the barrier layer, and depositing a layer of α-Ta on the side portions of the barrier layer, at a thickness less than about 10 Å, e.g., less than about 3 Å. Embodiments of the present invention further include depositing discontinuous regions of clusters of Ta atoms by PVD on the side portions of the barrier layer. Embodiments of the present invention further include forming a dual damascene opening in a dielectric layer having a relatively low dielectric constant, such as a dielectric constant (k) less than about 3.9.

Another aspect of the present invention is a method of manufacturing a semiconductor device, the method comprising: forming an opening in a dielectric layer; depositing a barrier layer by chemical vapor deposition or atomic layer deposition lining the opening, the barrier layer comprising a bottom portion and side portions; depositing a layer of tantalum (Ta) by physical vapor deposition, at a thickness less than 30 Å, on the bottom surface of the barrier layer; depositing a seedlayer on the Ta layer and over the side portions of the barrier layer; and filling the opening with copper (Cu) or a Cu alloy.

Embodiments of the present invention comprise depositing an α-Ta layer on a tantalum nitride barrier layer lining a dual damascene opening, depositing a seedlayer by PVD, electroplating or electrolessly depositing the Cu or Cu alloy layer on the seedlayer filling the opening and over the dielectric layer, removing any portion of the Cu or Cu alloy layer beyond the opening by chemical mechanical polishing (CMP) and depositing a silicon nitride or silicon carbide barrier layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 5 and in FIGS. 6 through 12, similar elements or features are denoted by similar reference numerals.

DESCRIPTION OF THE INVENTION

Figure 1:
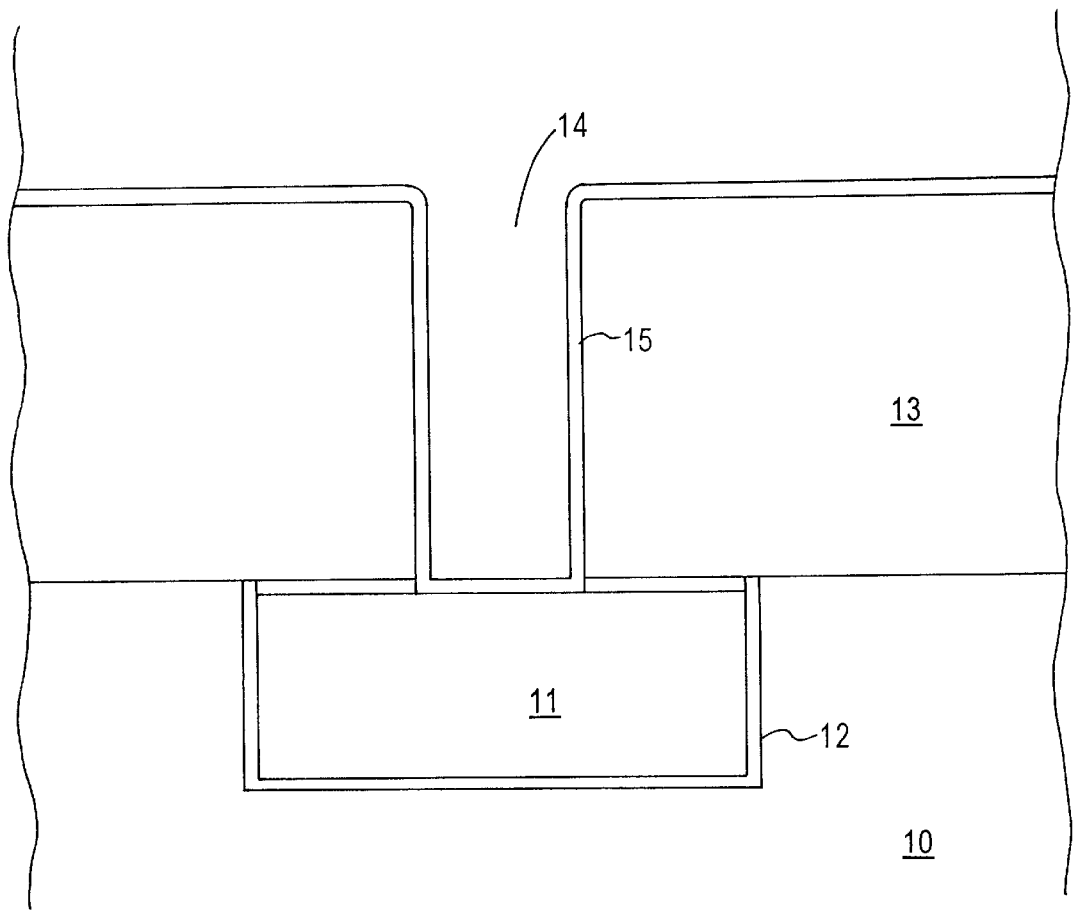
FIGS. 1 through 5 schematically illustrate sequential phases of a single damascene embodiment of the present invention.

The present invention addresses and solves problems attendant upon forming Cu or Cu alloy interconnects, particularly damascene structures, such as damascene structures formed in dielectric layer(s) having a dielectric constant less than about 3.9. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, germanium, strontium, platinum, calcium, aluminum or zirconium.

As design rules are scaled down into the deep submicron range, such as about 0.12 micron and under, electromigration and contact resistance issues associated with Cu interconnects become increasingly significant. Such reliability issues stem, in part, from the inability to satisfactfully deposit a conformal barrier layer which not only does not adversely interact with a subsequently deposited seedlayer for Cu deposition to adversely raise the contact resistance and results in poor feature filling, but minimizes electromigration problems and increases via chain yield. The present invention addresses and solves such problems by initially depositing a conformal barrier layer, such as tantalum nitride, titanium silicon nitride (TiSiN) or titanium nitride (TiN) with a thin layer of silicon (Si), e.g., about 10 to 20 Å, thereon, by CVD lining an opening. The barrier layer can also be deposited by atomic layer deposition (ALD) a form of CVD, wherein the reactants are introduced one at a time to saturate the substrate and evacuated before the next reactant is introduced, such that the film is grown layer by layer. Subsequently, a flash or very thin layer of Ta, e.g., α-Ta, is deposited by PVD on at least the bottom portion of the barrier layer at a thickness less than 30 Å. A suitable thickness for the flash Ta layer on the bottom portion of the barrier layer may range from about 5 Å to about 30 Å, e.g., about 8 Å to about 24 Å. Embodiments of the present invention include a very thin layer of Ta, e.g., α-Ta, on the side portions of the barrier layer, as at a thickness up to about 10 Å, e.g., up to about 3 Å. Embodiments of the present invention also include depositing discontinuous regions comprising clusters of Ta atoms on the side portions of the barrier layer.

A seedlayer, for subsequent Cu depositions, is then deposited. It was found that the depositions of a flash or very thin Ta layer by PVD on the barrier layer, prior to depositing the seedlayer, prevented or substantially avoided adverse degradation of the interface between the CVD barrier layer and PVD seedlayer which would otherwise increase contact resistance and prevent effective via filling. It was also found that the use of a very thin PVD Ta layer resulted in improved electromigration resistance and increased in via chain yield. Advantageously, embodiments of the present invention enable complete filling of vias having high aspect ratios, such as 2:1 to 4:1.

Embodiments of the present invention comprise forming an opening in a dielectric layer, such as a contact/via opening, a trench, or a dual damascene opening comprising an upper trench section communicating with a lower contact/via section, depositing the barrier layer by CVD at a thickness of about 20 Å to about 100 Å, e.g., about 50 Å to about 100 Å, lining the opening. Barrier layers suitable for use in the present invention include tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride.

After depositing the Ta layer by PVD, e.g., an α Ta layer on a TaN barrier layer, a seedlayer for subsequent Cu deposition is deposited. The seedlayer can be deposited at a suitable thickness, such as about 80 Å to about 200 Å, and can comprise Cu alloys containing magnesium, aluminum, zinc, zirconium, tin, nickel, palladium, silver or gold in a suitable amount, e.g., about 0.3 to about 12 at. %. In implementing damascene techniques in accordance with embodiments of the present invention, Cu can be deposited by electroless deposition or electroplating. CMP is then performed such at the upper surface of the inlaid Cu is substantially coplanar with upper surface of the dielectric layer.

In accordance with embodiments of the present invention, the flash Ta layer can be deposited by ionized metalization plasma (IMP) employing a DC power of 1000 watts and RF power of 2500 watts, using an argon flow of 60 SCCM and a 300 watt bias for about 3.5 seconds. The flash Ta layer can also be deposited by other PVD techniques, such as self ionized plasma (SIP).

A single Cu damascene embodiment of the present invention is schematically illustrated in FIGS. 1 through 5, wherein similar features or elements are denoted by similar reference numerals. Adverting to FIG. 1, reference numeral 11 denotes an underlying metal feature, e.g., a Cu feature, bounded by barrier layer 12 formed in dielectric layer 10. A dielectric layer 13 is then formed thereon, e.g., a low-k interlayer dielectric, and an opening 14 formed therein. An initial conformal barrier layer 15, such as TiSiN, is then deposited by CVD lining the opening and on the upper surface of dielectric layer 13.

Figure 2:
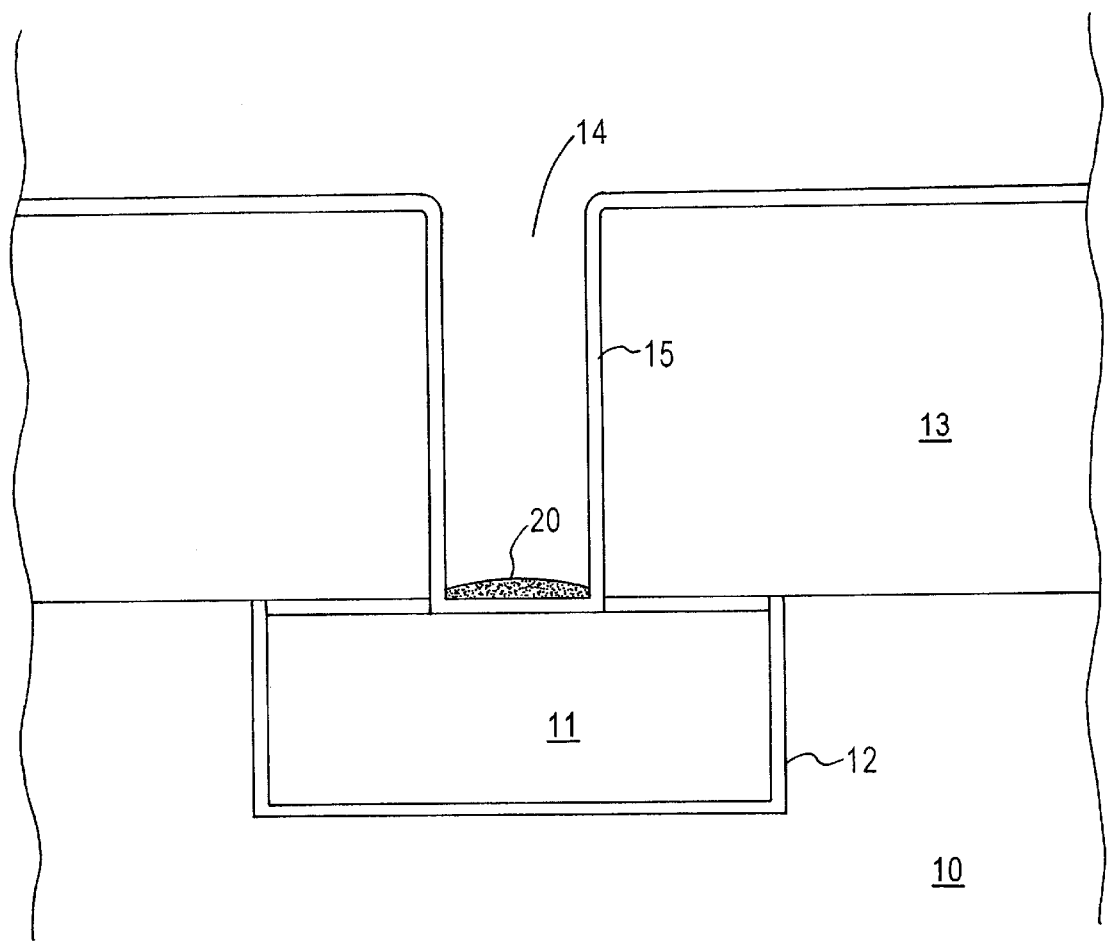

Subsequently, as illustrated in FIG. 2, a thin layer of α-Ta 20 is deposited on the bottom surface of conformal barrier layer 15. Flash α-Ta layer 20 is typically formed by PVD at a thickness of less than 30 Å, such as about 5 Å to about 30 Å, e.g., about 8 Å to about 24 Å.

Figure 3:
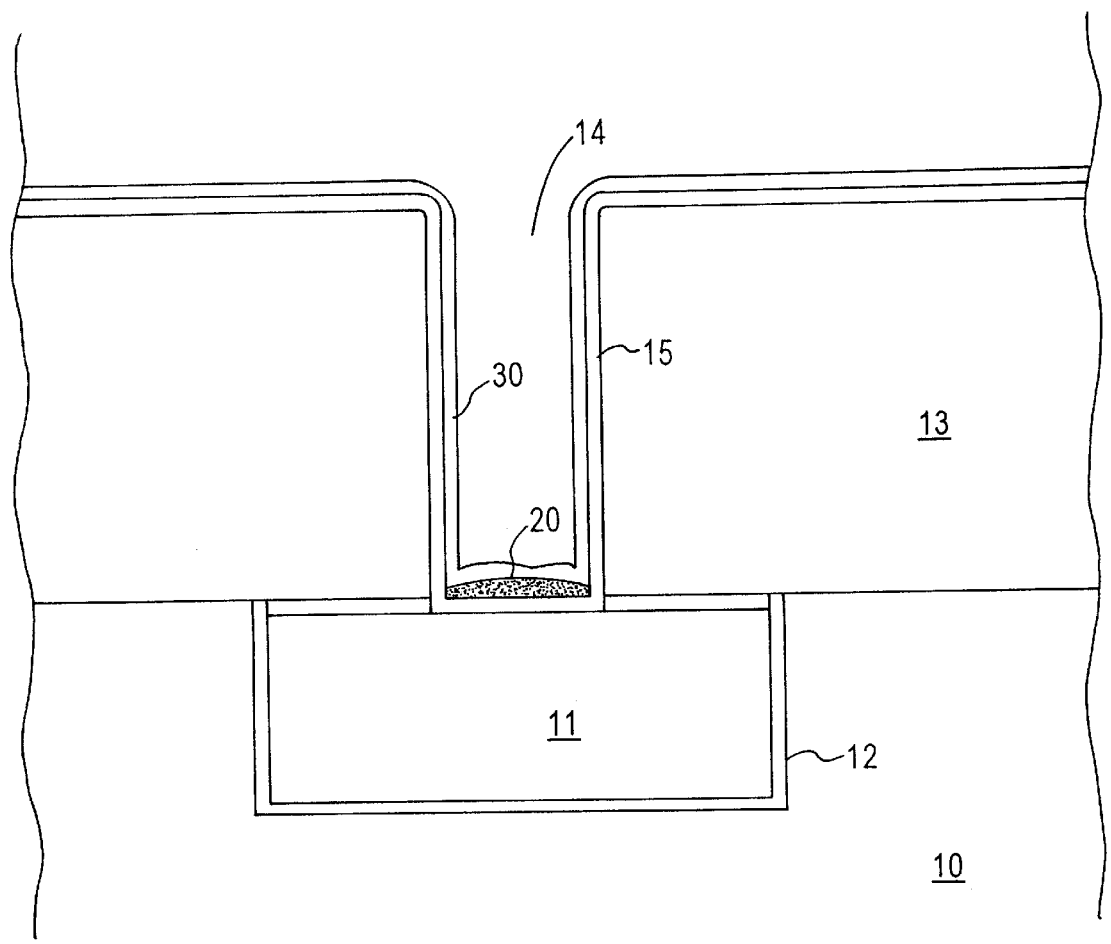
Figure 4:
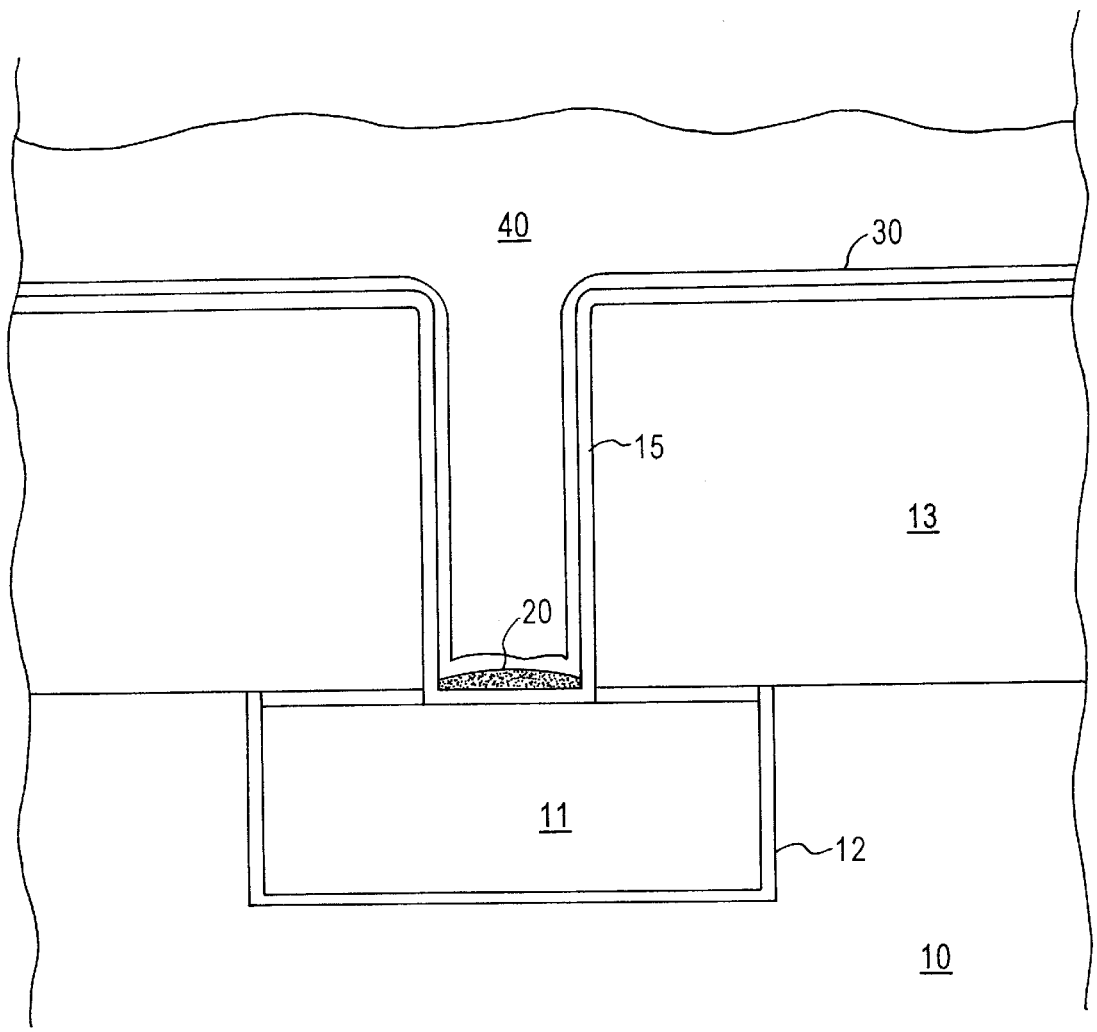
Figure 5:
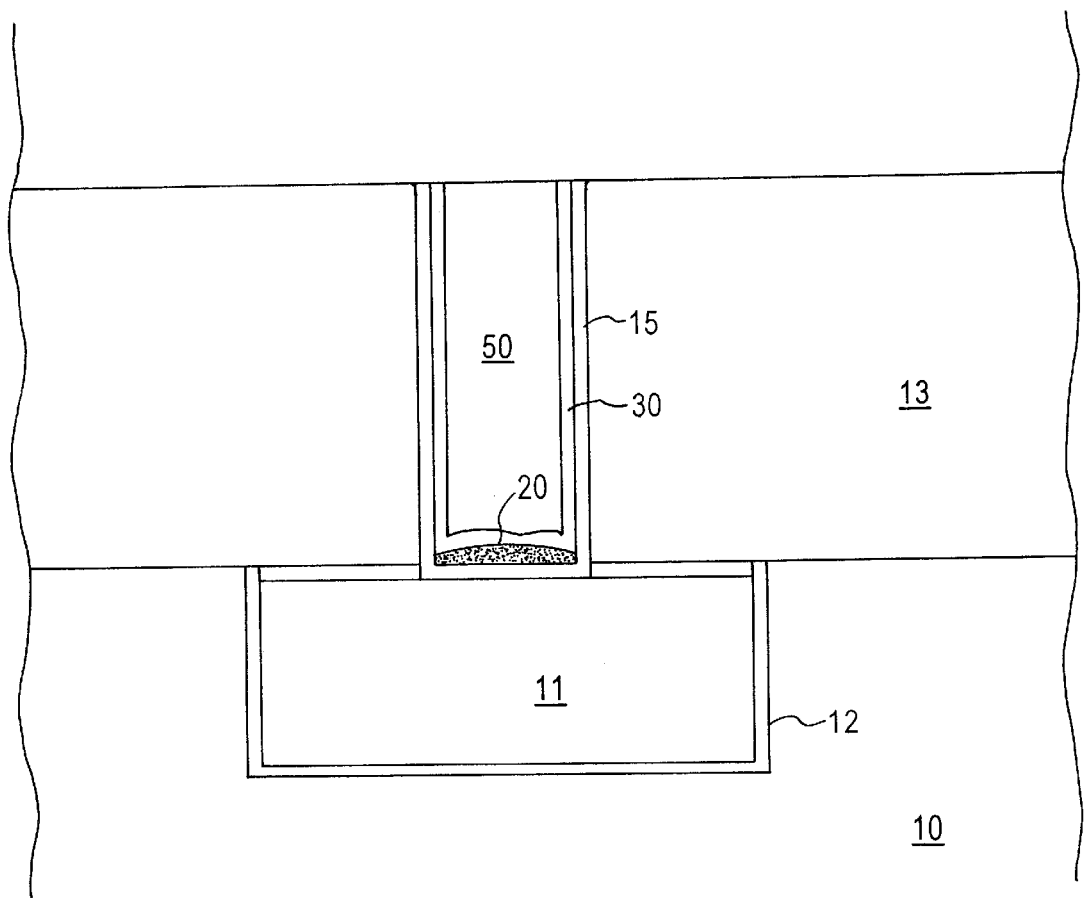

Subsequently, as illustrated in FIG. 3, a seedlayer 30 is deposited on the flash α-Ta layer 20 and over the side surfaces of conformal barrier layer 15. In other embodiments of the present invention, a flash layer of Ta is also deposited on the side portions of barrier layer 15, as at a thickness less than about 10 Å, e.g., less than about 3 Å. Embodiments of the present invention also include depositing discontinuous regions comprising clusters of Ta atoms on the side portions of barrier layer 15, at a thickness not exceeding 10 Å. As illustrated in FIG. 4, Cu 40 is then deposited, as by electroless deposition or electroplating. CMP is then conducted to planarize the upper surface resulting in a structure as schematically illustrated in FIG. 5 containing Cu via 50.

Figure 6:
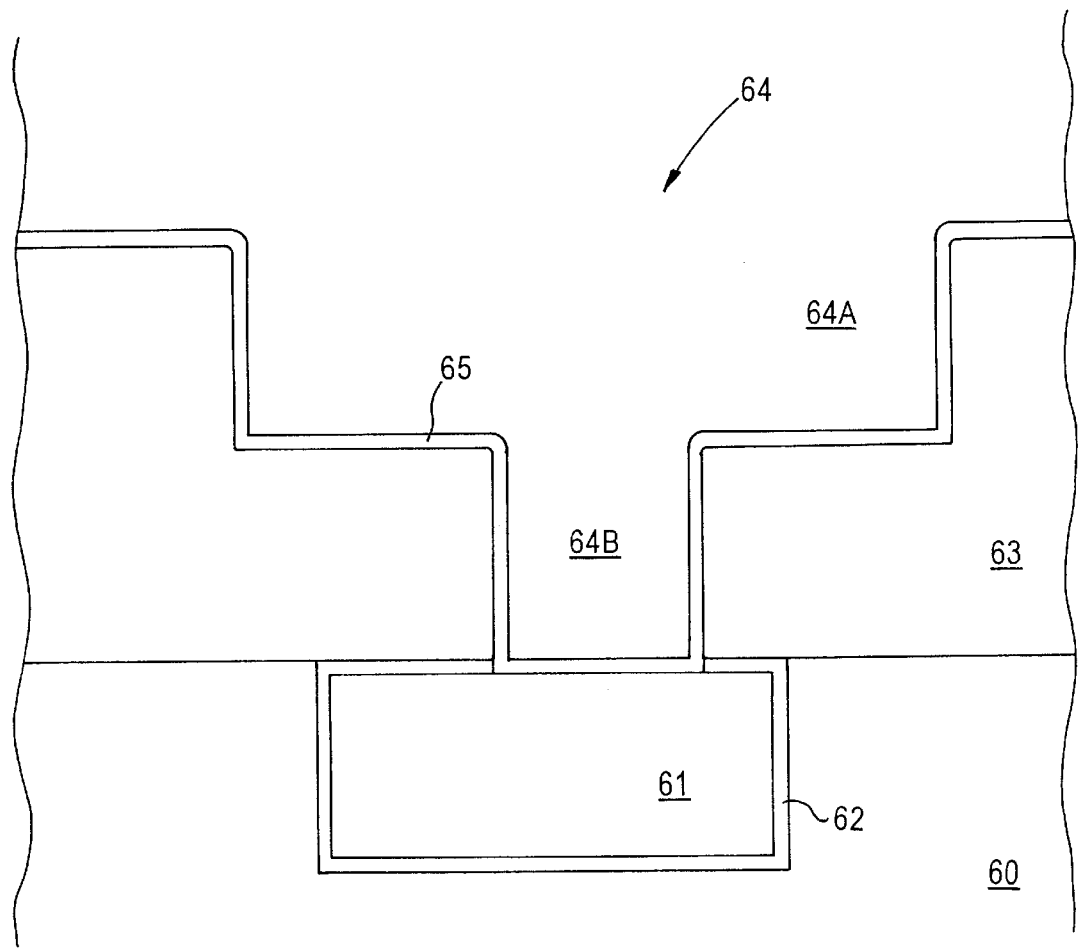
FIGS. 6 through 10 schematically illustrate sequential phases of a dual damascene embodiment of the present invention.
Figure 7:
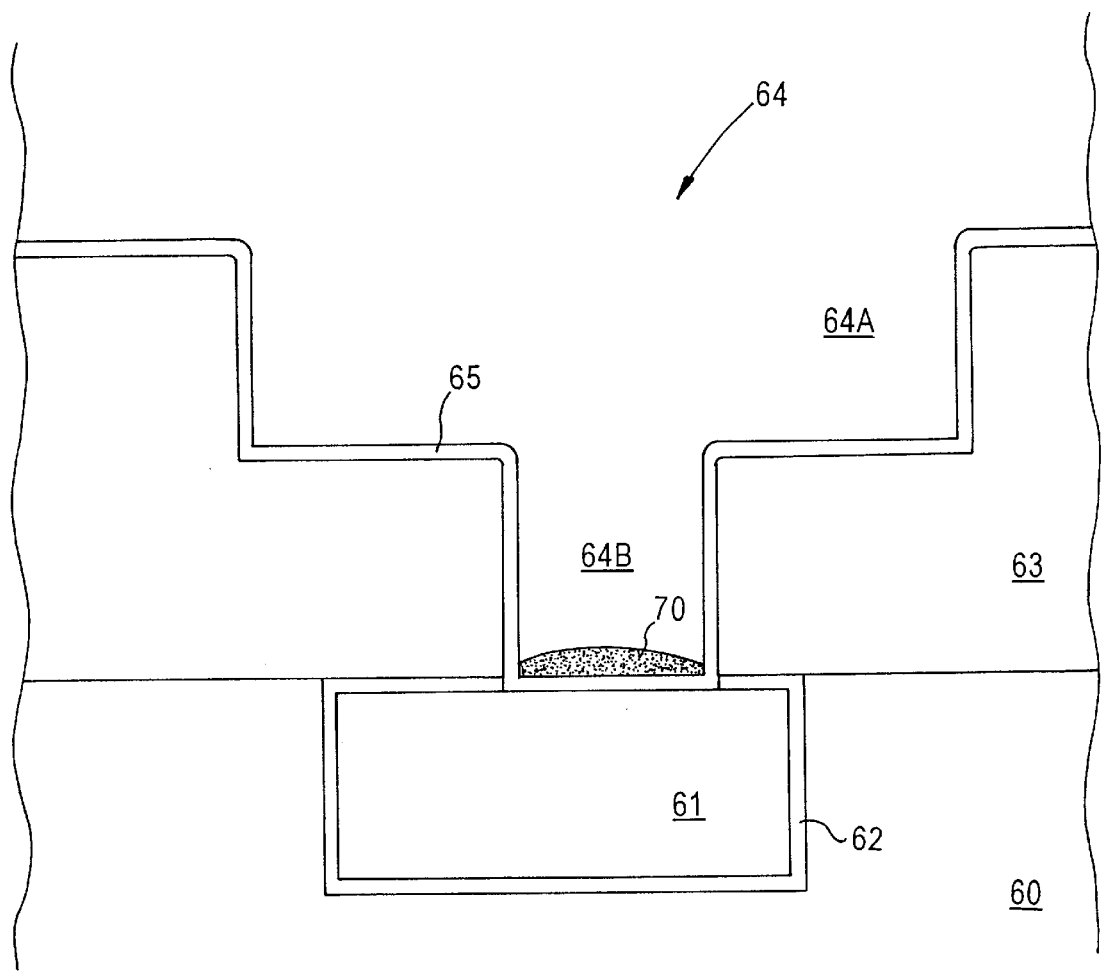

A dual damascene embodiment of the present invention is schematically illustrated in FIGS. 6 though 10. Adverting to FIG. 6, a lower metal feature 61, e.g., a Cu line, bounded by barrier layer 62, is formed in an underlying dielectric layer 60, e.g., a dielectric layer containing a low-k dielectric material. A dual damascene opening 64, comprising an upper trench section 64A connected to a lower via hole section 64B, is formed in dielectric layer 63, e.g., an interlayer dielectric comprising a low-k dielectric material. A conformal barrier layer 65 such as TiSiN, is then deposited by CVD. Subsequently, as shown in FIG. 7, a flash layer of α-Ta 70 is deposited by PVD on the bottom portion of conformal barrier layer 65, as at a thickness of about 5 Å to about 30 Å.

Figure 8:
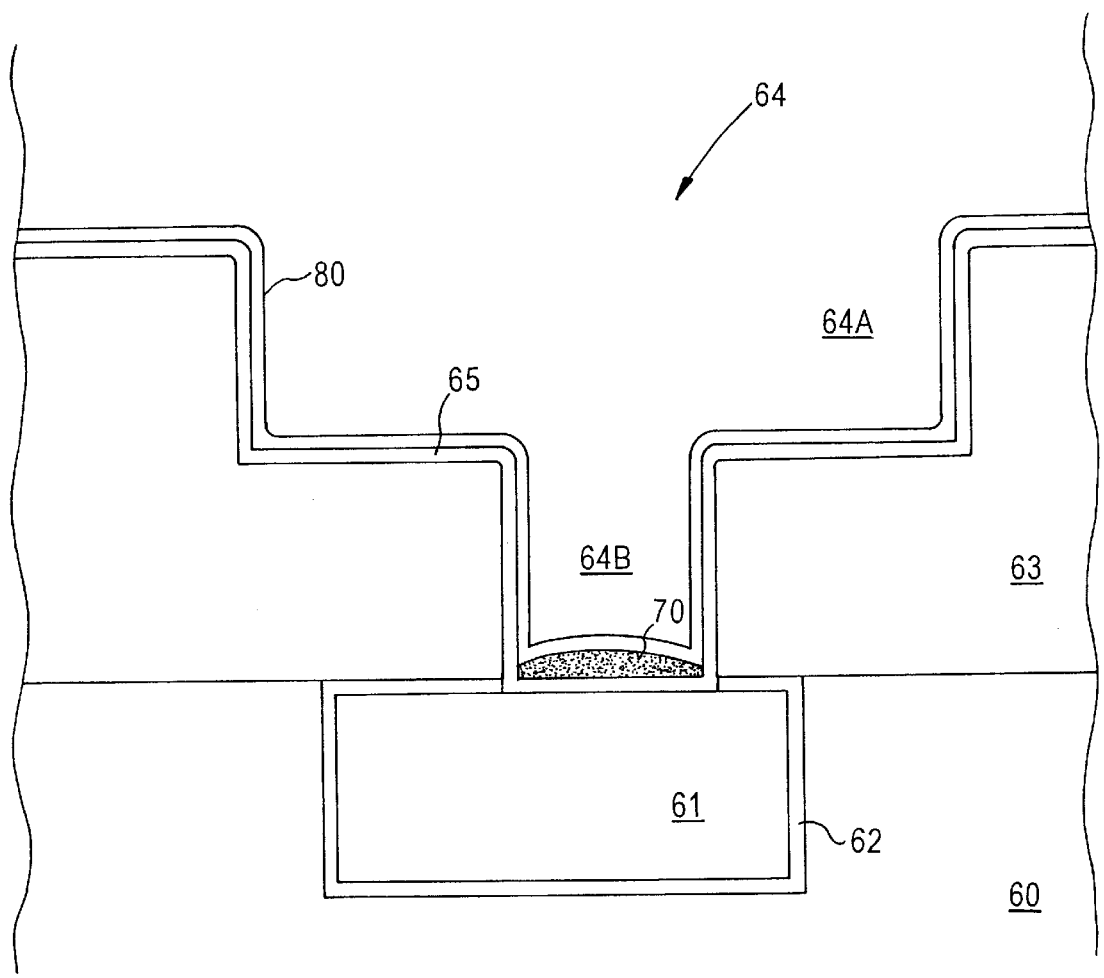
Figure 9:
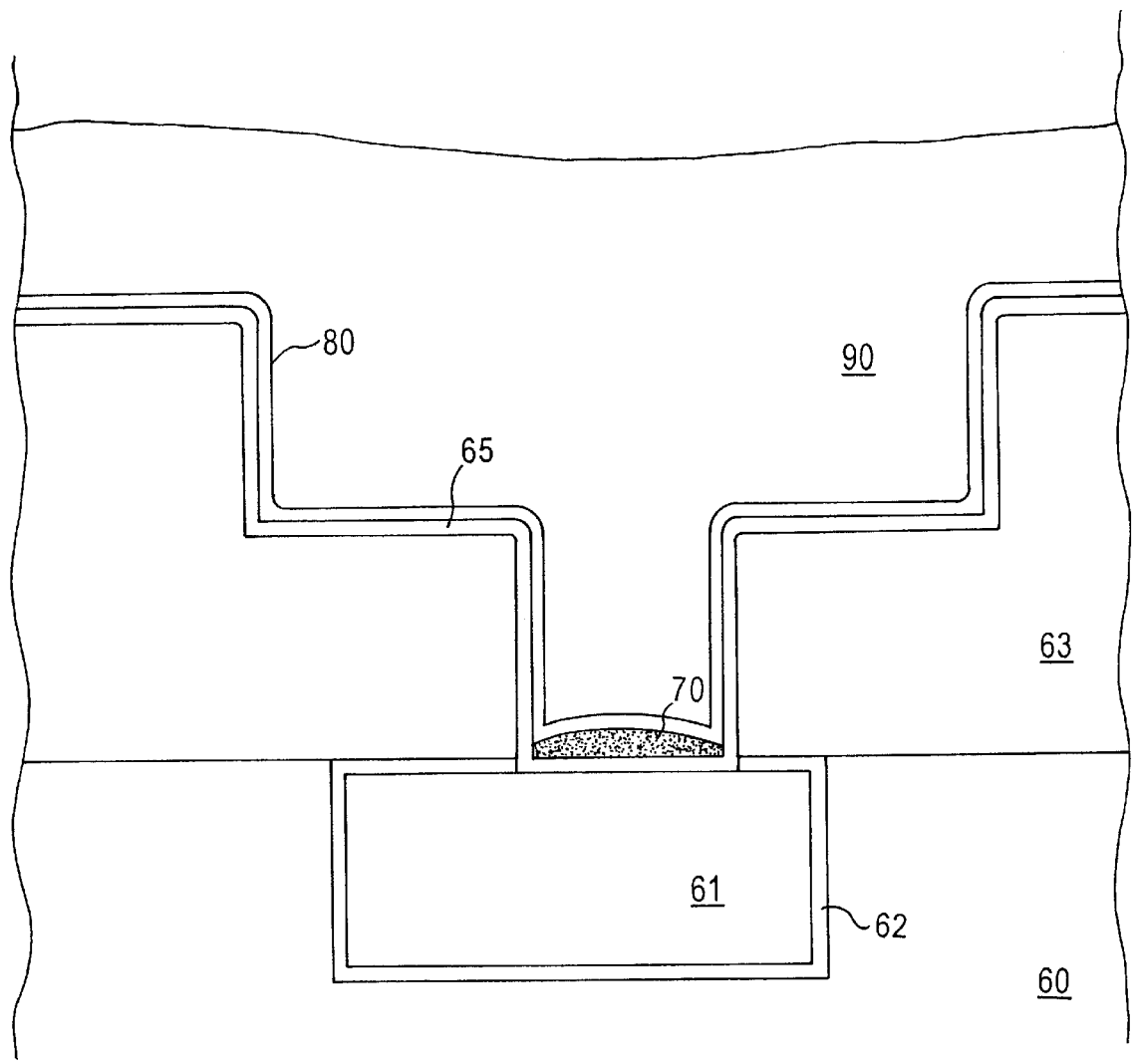
Figure 10:
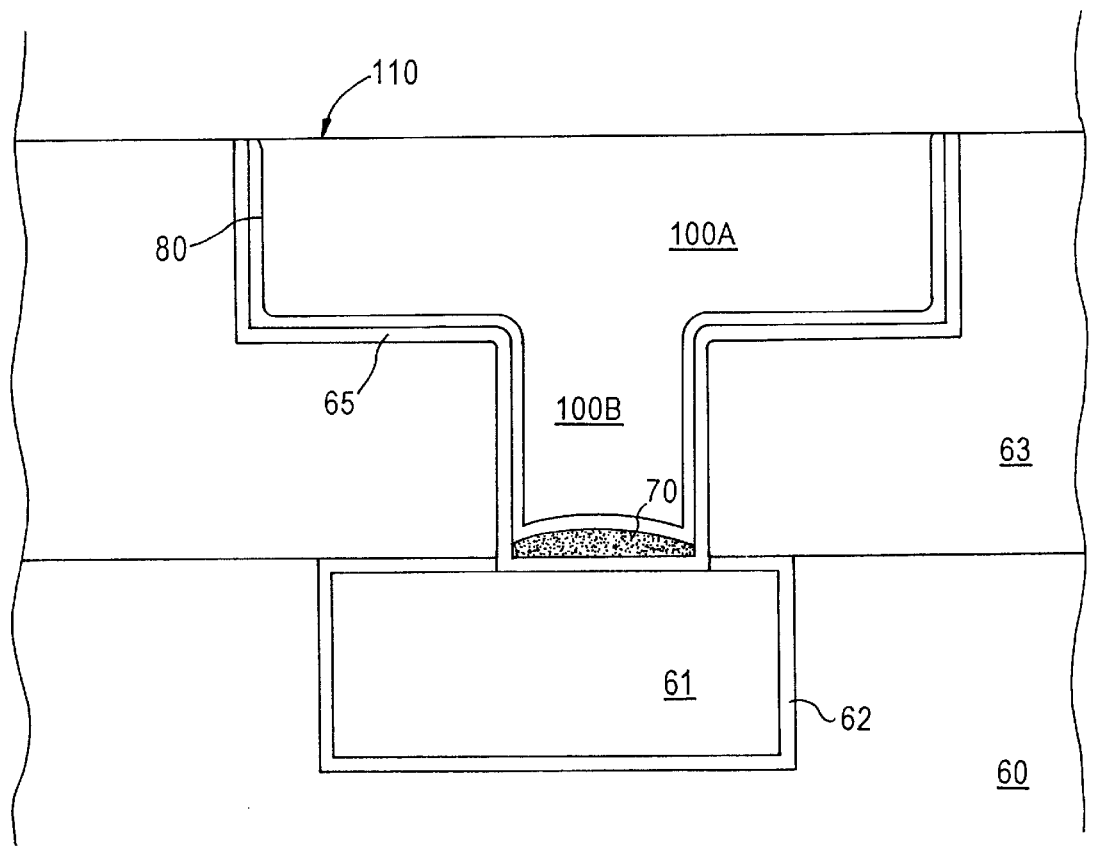

As shown in FIG. 8, a seedlayer 80, for subsequent Cu deposition, is then deposited on α-Ta layer 70 and over the side portions of dielectric layer 65. As shown in FIG. 9, Cu 90 is then deposited, as by electroless deposition or electroplating. CMP is then conducted to substantially planarize upper surface 110 as shown in FIG. 10, to form a damascene structure comprising upper Cu line 100A connected to lower Cu via 100B.

Figure 11:
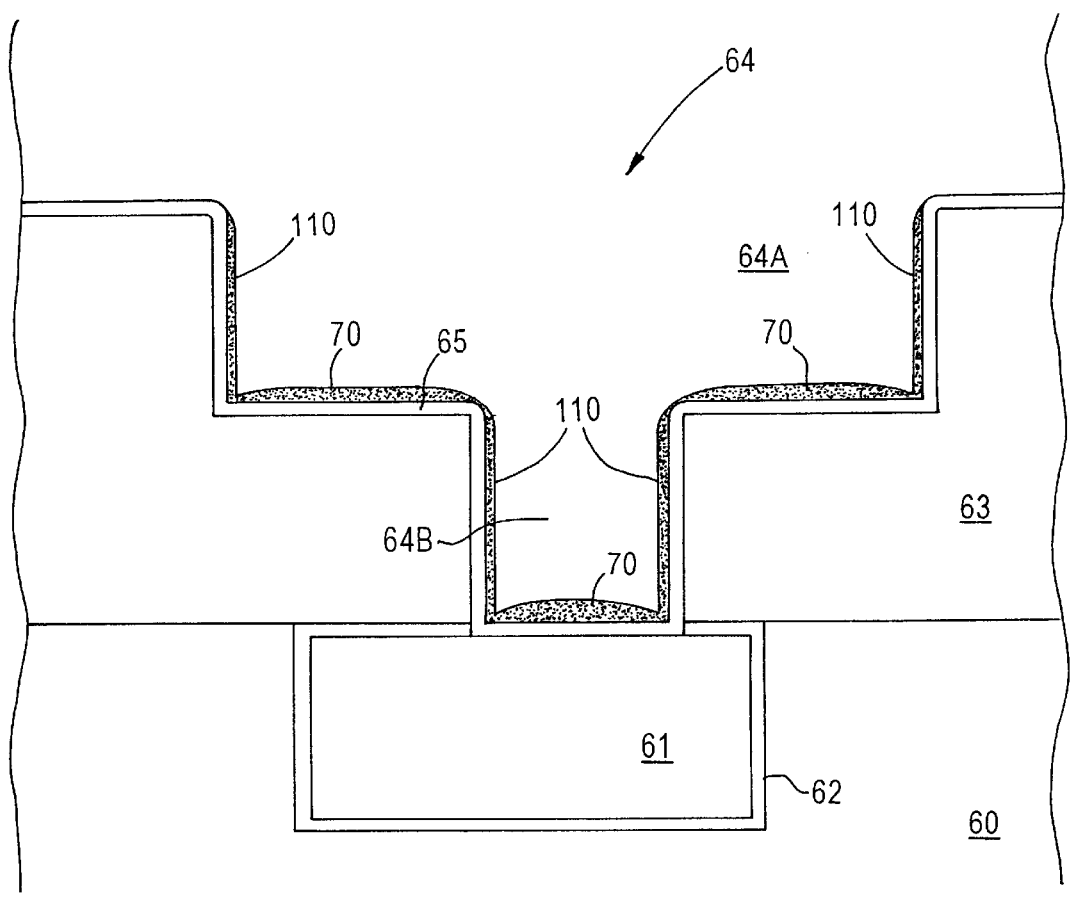
FIGS. 11 and 12 illustrate further dual damascene embodiments of the present invention.

Embodiments of the present invention include depositing a flash α-Ta layer 70, at a thickness of about 5 Å to about 30 Å, e.g., about 8 Å to about 24 Å, at the bottom of the via and at the bottom of the trench 64A, as shown in FIG. 11. As shown in FIG. 11, a thin flash layer of α-Ta 110 is also deposited on the side portions of conformal barrier layer 65, as at a thickness less than about 10 Å, e.g., less than about 3 Å. Subsequent processing of the Cu interconnect is conducted as in FIGS. 7 through 10.

Figure 12:
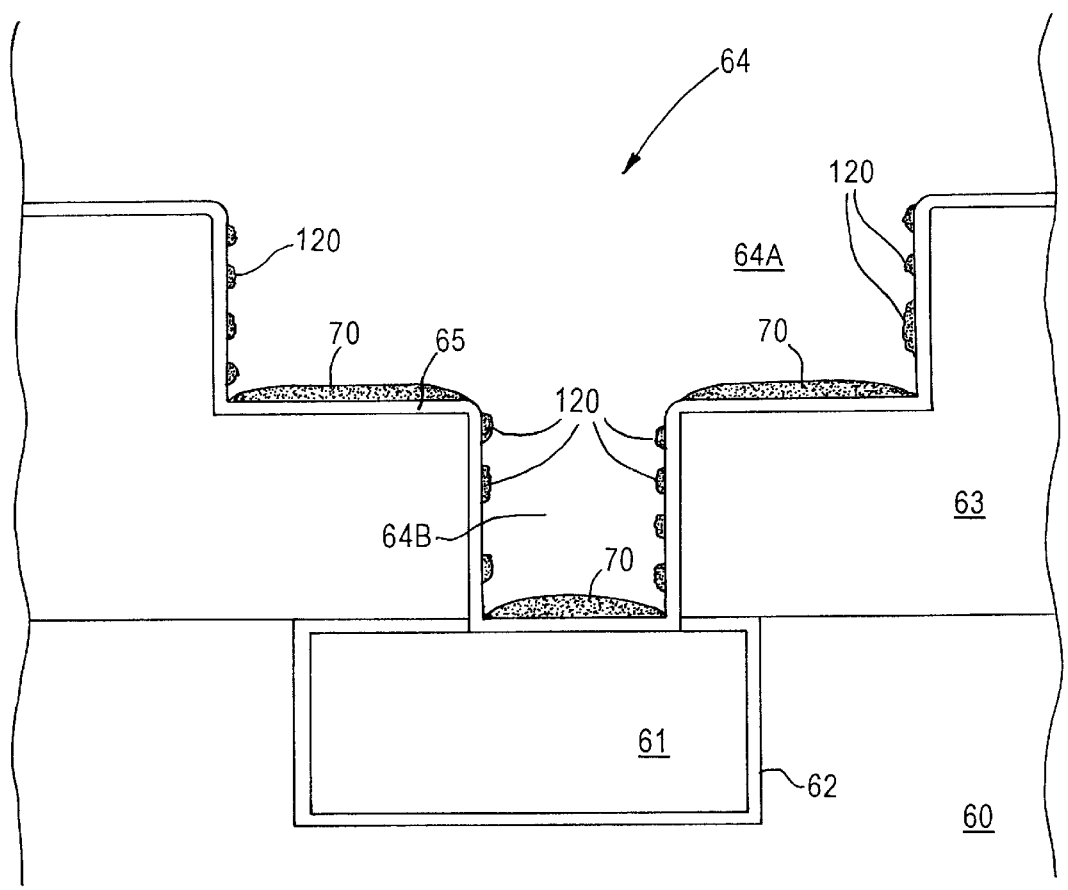

In another embodiment of the present invention, as shown in FIG. 12, a flash α-Ta layer is also deposited on the bottom portions of trench 64A. In addition, as also shown in FIG. 12, discontinuous regions 120 comprising clusters of Ta atoms are formed on the side surfaces of barrier layer 65. Discontinuous regions 120 have a thickness no greater than about 10 Å, e.g., no greater than about 3 Å. Subsequent processing of the embodiment schematically illustrated in FIG. 12 proceeds as in FIGS. 7 though 10.

In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron- and phosphorus doped silicate glass (BPSG), and silicon dioxide derived from tetraethyl orthosilicate (TEOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include FO$_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

The present invention enables the fabrication of semiconductor devices having Cu interconnects with improved electromigration resistance, enhanced reliability, reduced contact resistance, and increased via chain yield. The formation of a very thin Ta layer, such an α-Ta layer, at a thickness less than 30 Å, by PVD not only avoids adverse interaction with the subsequently deposited seedlayer, but also results in an improvement in electromigration resistance and increased via chain yield.

The present invention enjoys industrial applicability in the formation of various types of inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A semiconductor device comprising:

an opening formed in a dielectric layer;

a barrier layer lining the opening, the barrier layer comprising a bottom portion and side portions;

a layer of tantalum (Ta), deposited by physical vapor deposition and having a thickness less than 30 Å, on the bottom portion of the barrier layer;

discontinuous regions of clusters of Ta atoms on the side portions of the barrier layer;

a seedlayer on the layer of Ta and over the side portions of the barrier layer and the clusters of Ta atoms; and copper (Cu) or a Cu alloy filling the opening.

2. The semiconductor device according to claim 1, wherein the barrier layer comprises a material selected from the group consisting of tantalum nitride, titanium silicon nitride, tungsten nitride, titanium, titanium-tungsten, tungsten, titanium-titanium nitride, tungsten silicon nitride, tantalum silicon nitride silicon nitride and titanium nitride with a layer of silicon thereon.

3. The semiconductor device according to claim 1, wherein the layer of Ta comprises alpha (2)-Ta.

4. The semiconductor device according to claim 1, wherein the opening is a dual damascene opening and the filled opening comprises an upper Cu or Cu alloy line connected to a lower Cu or Cu alloy via.

5. The semiconductor device according to claim 1, wherein the layer of Ta layer has a thickness of about 5 Å to about 30 Å.

6. The semiconductor device according to claim 5, wherein the layer of Ta has a thickness of about 8 Å to about 24 Å.

7. A semiconductor device comprising:

an opening formed in a dielectric layer;

a barrier layer lining the opening, the barrier layer comprising a bottom portion and side portions;

a first layer of tantalum (Ta) deposited by physical vapor deposition and having a thickness less than 30 Å, on the bottom portion of the barrier layer;

a discontinuous second layer of Ta, having a thickness less than 10 Å, on the side portions of the barrier layer;

a seedlayer on the first layer of Ta and in direct contact with the barrier layer; and copper (Cu) or a Cu alloy filling the opening.

8. The semiconductor device according to claim 7, wherein the discontinuous second layer of Ta on the side portions of the barrier layer has a thickness less than about 3 Å.

9. A method of manufacturing a semiconductor device, the method comprising:

forming an opening in a dielectric layer;

depositing a barrier layer by chemical vapor deposition or atomic layer deposition lining the opening, the barrier layer comprising a bottom portion and side portions;

depositing a layer of tantalum (Ta) by physical vapor deposition, at a thickness less than 30 Å, on the bottom portion of the barrier layer;

depositing discontinuous regions of clusters of Ta atoms by physical vapor deposition on side portions of the barrier layer;

depositing a seedlayer on the layer of Ta and over the side portions of the barrier layer; and filling the opening with copper (Cu) or a Cu alloy.

10. The method according to claim 9, comprising depositing the barrier layer of a material selected from a group consisting of tantalum nitride, titanium nitride, titanium, titanium-tungsten, tungsten, tungsten nitride, titanium-titanium nitride, titanium silicon nitride, tungsten silicon nitride, tantalum silicon nitride and silicon nitride.

11. The method according to claim 9, comprising a depositing a layer of alpha (2)-Ta as the layer of Ta by physical vapor deposition.

12. The method according to claim 9, comprising:

forming the opening as a dual damascene opening; and filling the opening with the Cu or Cu alloy to form a Cu or Cu alloy line connected to a Cu or Cu alloy via.

13. The method according to claim 9, comprising depositing the layer of Ta at a thickness of about 5 Å to about 30 Å.

14. The method according to claim 13, comprising depositing the layer of Ta at a thickness of about 8 Å to about 24 Å.

15. A method of manufacturing a semiconductor device, the method comprising:

forming an opening in a dielectric layer:

depositing a barrier layer by chemical vapor deposition or atomic layer deposition lining the opening, the barrier layer comprising a bottom portion and side portions;

depositing a first layer of tantalum (Ta) by physical vapor deposition at a thickness less than 30 Å, on the bottom portion of the barrier layer;

depositing a discontinuous second layer of Ta on the side portions of the barrier layer at a thickness less than about 10 Å;

depositing a seedlayer on the first layer of Ta and in direct contact with the barrier layer; and filling the opening with copper (Cu) or a Cu alloy.

16. The method according to claim 15, comprising depositing the discontinuous second layer of Ta on side portions of the barrier layer at a thickness less than about 3 Å.

* * * * *

UNITED STATES PATENT AND TRADEMARK OFFICE
CERTIFICATE OF CORRECTION

PATENT NO.    : 6,727,592 B1
DATED         : April 27, 2004
INVENTOR(S)   : Christy Mei-Chu Woo et al.

It is certified that error appears in the above-identified patent and that said Letters Patent is hereby corrected as shown below:

Column 7,
Line 38, change "(2)" to -- ($\alpha$) --
Line 44, delete "layer"

Column 8,
Line 29, change "(2)" to -- ($\alpha$) --

Signed and Sealed this

Twenty-seventh Day of July, 2004

JON W. DUDAS
*Acting Director of the United States Patent and Trademark Office*